United States Patent [19]

Miille

[11] Patent Number: 4,483,178

[45] Date of Patent: Nov. 20, 1984

[54] PNEUMATIC-DIGITAL CONVERTER SYSTEM AND METHOD

[76] Inventor: Jerry L. Miille, 1303 Gulf, Pasadena, Tex. 77502

[21] Appl. No.: 458,913

[22] Filed: Jan. 18, 1983

[51] Int. Cl.$^3$ .................... G01L 15/00; G01L 19/04; G01L 27/00

[52] U.S. Cl. .................................... 73/1 R; 73/4 R; 73/708; 73/756; 339/16 R; 361/415

[58] Field of Search ................. 73/1 R, 4 R, 708, 714, 73/756; 340/870.13; 361/394, 412–415, 395; 339/15, 16 R

[56] References Cited

U.S. PATENT DOCUMENTS 3,790,910 2/1974 McCormack .......................... 73/4 R
4,133,022 1/1979 Moore et al. .................... 361/415 X Primary Examiner—James J. Gill
Attorney, Agent, or Firm—Carwell & Helmreich

[57] ABSTRACT

A general purpose pneumatic-digital converter system and method for process control or the like. A chassis includes a plurality of pneumatic connectors interconnected to pressure lines to be monitored and a pc motherboard carrying a plurality of electrical connectors. At least one pressure-digital module assembly has pneumatic and electrical connectors disposed thereon whereby simultaneous connection is made to corresponding connectors on the chassis when the module is plugged in. Each module may contain a pressure transducer, analog-digital converter, and $E^2$ PROM wherein data is stored to compensate for non-linearities, offsets, gains, etc. of the transducer and converter. An additional electrical connector is provided on the motherboard proximal to each of the electrical connectors which are intended for a corresponding module assembly connector, whereby additional pc boards for signal processing, communication, memory, or the like may be plugged into the motherboard. The motherboard and electrical connectors are in standard bus format whereby intercommunication is enabled between pc boards and module assemblies plugged into the motherboard.

8 Claims, 5 Drawing Figures

PNEUMATIC-DIGITAL CONVERTER SYSTEM AND METHOD

BACKGROUND OF THE INVENTION

This invention relates to methods and apparatus for converting pneumatic to electrical signals and conversely, and more particularly, relates to a general purpose pneumatic to digital converter system adaptable to process control and pressure monitoring systems for boilers, paper mill plants, refineries, or the like.

In such systems, it is frequently desirable to control or monitor pressures at a plurality of various critical points such as valve ports located along the process. Moreover, it is conventional to convey these pressures to a central control chassis by means of charged pneumatic lines. The chassis is provided with appropriate pressure transducers and circuitry for processing and conditioning the transducer analog voltage outputs for delivery on electrical lines from the chassis to a desired location, as for example, to a host process control computer.

One problem with such approaches is that transducers are frequently in need of replacement or recalibration due to burnouts, changes in characteristics such as offset, gain or transfer function non-linearities due to temperature effects, aging, etc., and the like. In such instances, the particular pressure line involved is shut off and disconnected from the chassis, the associated transducer is removed and repaired or replaced, the pressure line is thence reattached, and the pressure point is thus able to be monitored again.

However, several severe problems are associated with this approach. First, it is not unusual to seek to measure or control as many as 32 or more pressure points in a typical application, and it will be readily apparent that it can become quite time consuming to perform for each such point the aforementioned steps of shutting off the pressure line associated with the point, disconnecting the line and associated transducer, replacing the transducer, reconnecting and then recharging the pressure line. Moreover, the possibility is manifest for introduction of leaks due to faulty connection of numerous pressure lines, or worse yet, errors in reconnection of pressure lines to incorrect locations on the chassis due in part to the large number of connections.

Still more serious, however, is the fact that during such disconnections, it is conventional to arrange for manual monitoring and control of the associated pressure points during transducer changes. Such monitoring often is unreliable, particularly in view of the fact that there may be inordinately long delays between the cessation of the automatic monitoring and transition to manual monitoring during transducer replacement. This, in turn, often leads to certain critical process points being left uncontrolled or monitored poorly (if at all). The result is production of bad product, for example, when critical set points in the process are permitted to stray, or more seriously, the creation of dangerous situations as, e.g., in the case of control of high pressure boilers, high temperature processes, or the like.

Unsuccessful attempt has been made to solve some of the aforementioned problems as, e.g., by various measures employing a combination of "quick connect" type electrical edge tab connectors and pneumatic self-seal connectors. For example, in the patent to More, U.S. Pat. No. 4,133,022, a rack assembly is provided as having a plurality of modules, each module carrying a pneumatic connector and electrical edge tab connector, both such connectors being adapted to quickly interconnect with mating connectors in the rack assembly when the module is plugged into it. However, such efforts have failed to provide a satisfactory general purpose pneumatic to digital converter system for various reasons.

First, there is frequently no provision for speedy and accurate registry of alignment of the pneumatic and electrical connectors to provide for reliable simultaneous interconnection of both connectors during module replacement. In other systems, there is further no provision for convenient electrical intercommunication between modules. This may be particularly important when it is realized that in the chassis it may be desirable to provide additional circuit board modules which interrelate and may interconnect by means of standard compatible bus formats to those carrying pressure transducers—such additional modules being provided for signal preprocessing for pressure limit checks or the like, for communication, memory, disc drive, or any of a number of desired functions.

Even if such interactive modules carrying pressure transducers could be provided which may be easily removed and replaced reliably and quickly, yet another problem relates to the characteristics of transducers themselves and associated analog to digital converters or other circuitry which may be desirably utilized therewith. More particularly, such transducers, converters, and other circuitry desirably located in a module may introduce inaccuracies which must be compensated for due to their particular offsets, gains, or transfer function characteristics which may exhibit non-linearities due to temperature changes or the like. While conventional approaches may have provided, in the form of look-up tables, some form of memory located in a given module for providing such compensation data automatically with the transducer as the module is substituted or plugged in, typically, the data must first be derived from the module circuitry which includes the associated transducer.

Then, in an additional separate step, this data is stored or burned in to a suitable memory device located remotely of the module, the memory device then later being installed in the module itself in yet a further step. The requirement of the separate steps of physically deriving data from within the module, storing it in a memory device remote from the module, and then installing the memory device in the module not only has been found to be time consuming, particularly in the tpyical case wherein multiple transducer modules are employed, but has been found to be unreliable as well.

These disadvantages of the prior art are overcome with the present invention, and a general purpose pneumatic-digital converter is herein provided for effecting, by means of a plug-in module transducer construction, quick and reliable change-outs of pressure transducers having improved abilitites for such modules to be calibrated and compensated. Further, such a converter is provided which affords flexibility in electrical interaction between such modules and any other desired circuitry resident on auxiliary printed circuit boards by means of a printed circuit motherboard into which the modules and auxiliary boards are plugged having standard bus compatibility.

SUMMARY OF THE INVENTION

A general purpose pneumatic-digital converter system and method is provided for process control and the like. A chassis is provided having a faceplate carrying at least one horizontal row of self seal quick connect pneumatic connectors and a pc motherboard also extending horizontally across the faceplate below and parallel to the connector row. A pc edge tab connector is mounted on the motherboard below each pneumatic connector and vertical alignment therewith.

A plurality of pressure to digital module assemblies is provided. Each module includes, disposed at one end therof in vertical alignment, at least one pneumatic connector and a pc board edge tab connector adapted to simultaneously mate in registry with corresponding vertically aligned pressure and edge tab connectors on the faceplate when the module is moved toward and plugged into the faceplate.

Pressures at process control points are delivered through pneumatic lines to respective pneumatic connectors on the faceplate. A pressure transducer in each module converts pressure delivered on its respective line to a corresponding correlative voltage and an analog/digital converter in the module converts the transducer analog voltage to digital form.

$E^2$ PROM in each module stores data to compensate for non-linearities, offsets and gains of the transucers and converter in the module. An additional electrical connector is provided on the motherboard proximal to each connector intended for a corresponding module assembly connector, whereby additional pc boards for signal processing, communication, memory, and the like may be plugged into the motherboard. The motherboard and electrical connectors are in standard bus format, whereby intercommunication is enabled between any pc board or module assembly by means of horizontal conductors on the motherboard interconnecting the electrical connector pins serving as common power supply, clock, data, control lines or the like.

Accordingly, it is a feature of the present invention to provide an improved general purpose pneumatic-to-digital process controller.

It is another feature of the present invention to provide a pneumatic-to-digital converter assembly with improved capability for replacement of a pressure transducer during ongoing operation of process control or monitoring.

It is a further feature of the present invention to provide such a converter wherein an improvement comprises reduction in time required to replace the transducer.

It is yet another feature of the present invention to provide a pneumatic-to-digital converter having pressure transducers arranged in the form of a plurality of modules each containing at least one such transducer wherein improved pneumatic and electrical connection between the module and a chassis are simultaneously made when the module is plugged into the chassis.

It is still a further feature of the present invention to provide means for automatically and immediately providing calibration data and compensation for non-linearities for a pressure transducer immediately upon a plug-in replacement of a pneumatic-to-digital converter module assembly, wherein the means includes a plug-in type pneumatic-to-digital converter module assembly having at least one pressure transducer and $E^2$ PROM memory containing the aforementioned transducer calibration and compensation data.

It is also a feature of the present invention to provide improved methods and apparatus for measuring and storing in a pneumatic-to-digital converter module data corresponding to offset, gain, and non-linearities of a pressure transducer contained in the module.

Still a further feature of the present invention is to provide methods and apparatus for simultaneously and instantaneously replacing a pressure transducer in a process controller or monitor while providing stored data functionally related to the transducer characterics by means of a plug-in type pneumatic-to-digital converter containing the replacement transducer and stored data related thereto.

It is another feature of the present invention to provide an improved general purpose pneumatic-to-digital converter chassis for receiving a plurality of plug-in printed circuit boards and plug-in modules carrying pressure transducers.

It is yet another feature of the present invention to provide the preceeding improved converter wherein each module may effect pneumatic and electrical connection to the chassis simultaneously by a plug-in operation, and wherein electrical communication between such printed circuit boards and modules is facilitated.

These and other features and advantages of this invention will become apparent from the following detailed description, wherein reference is made to the Figures in the accompanying drawings.

IN THE DRAWINGS

DETAILED DESCRIPTION OF THE INVENTION

Figure 1:
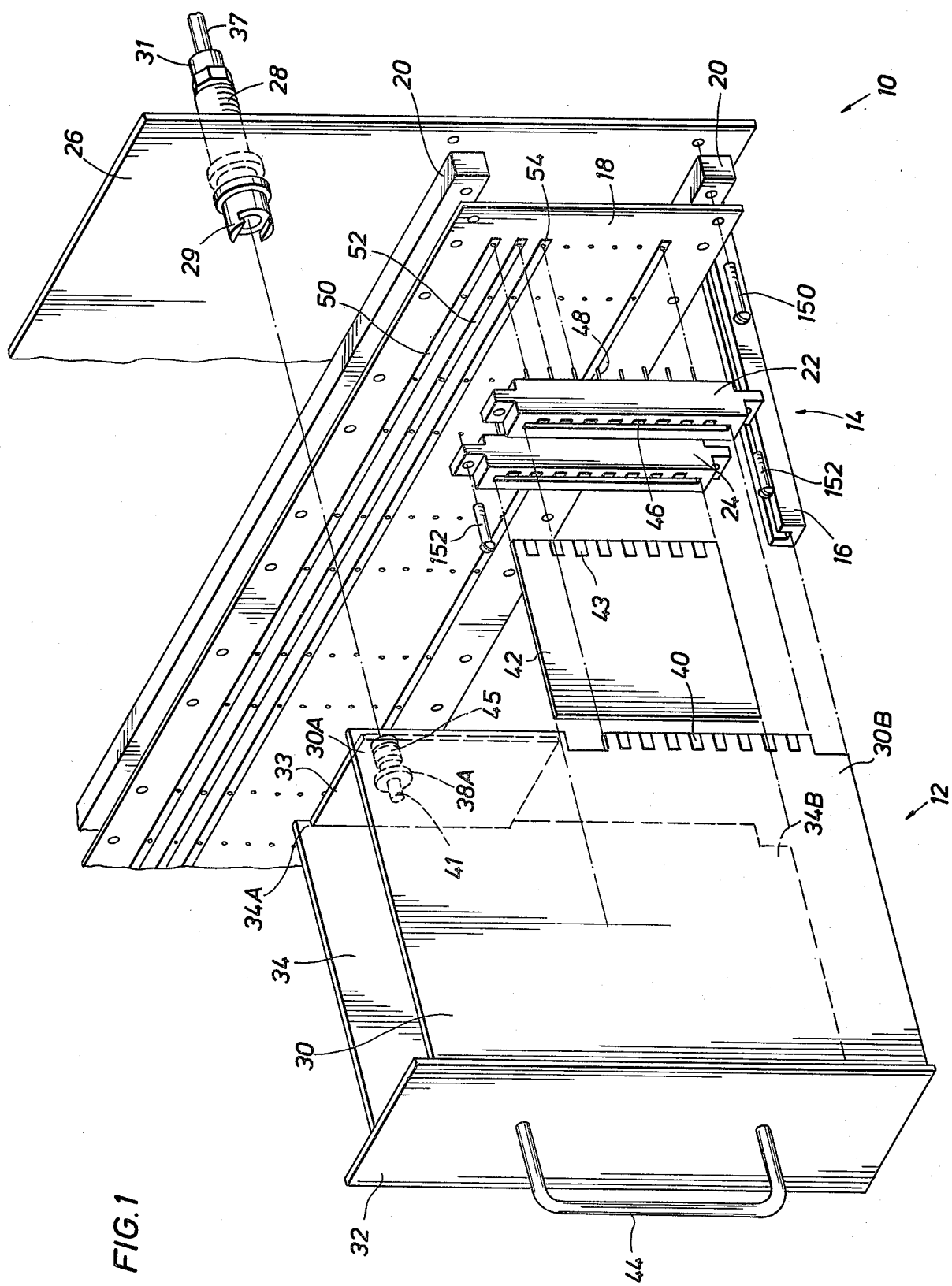
FIG. 1 depicts an isometric drawing of one embodiment of the present invention.

Referring first to FIG. 1, there may be seen depicted therein a particular embodiment of the pneumatic-digital converter assembly 10 of the present invention. The converter assembly 10 is generally comprised of a chassis frame 14 into which one or more module assemblies 12 and one or more pc boards 42 may be plugged in a manner to be described in more detail. An initial description in broad terms of operation of one embodiment of the present invention may assist in understanding a more detailed description thereof, and accordingly, it will first be noted that one or more pressurized pneumatic lines 37 may be routed to the converter assembly 10 from pressure points to be monitored or controlled as, for example, in the case of process control of a boiler plant, paper mill, or the like. Upon connection of the line 37 with connector 28 and a connector 38a on one of the module assemblies 12 (such connection to be described hererinafter in more detail), pressure from the remote point may thus be conveyed through the line 37 to a pressure transducer residing in module assembly 12 (not depicted in FIG. 1).

One of the purposes of at least one of these module assemblies 12 is to convert this pressure to a more convenient form, and accordingly one or more pressure transducers will reside in a typical module assembly 12 for conversion of this pressure to an analog voltage. Although not depicted in FIG. 1, each module assembly 12 may also typically contain an a-d converter for converting the analog transducer output to digital form and means for compensating for transducer non-linearities, gain and offset of the transducers and a-d converter, and the like. As will also be described in more detail, it will be apparent from FIG. 1 that due to the fact that numerous such module assemblies 12 and pc boards 42 may be interconnected by means of the mother board 18, extremely flexible signal processing, communication, control signal generation, and the like may be implemented and readily adapted to widely varying requirements and applications by means of plugging in the required circuitry carried on pc boards 42 or module assemblies 12 into motherboard 18 in a manner to be described hereinafter.

Still referring to FIG. 1, and, in particular, with reference to a more detailed description of the aforementioned chassis 14, it will be noted that the chassis 14 includes a faceplate 26 which carries the aforementioned pneumatic connector 28. In particular, it will be noted that, for reasons which will become readily apparent shortly, the faceplate 26 will also carry a pc board edge tab connector 22 disposed thereon preferably in approximate vertical alignment with the pressure connector 28. It should be noted at this point that whereas only one self-sealing "quick connect" pressure connector 28 and mating pressure connector 38a have been depicted in FIG. 1, it is within the scope of the present invention to provide any desired number of such connectors 28 arranged in vertical alignment and carried by faceplate 26 and adapted for mating engagement with a corresponding number of pressure connectors carried by the module assembly 12 also in vertical alignment. It will further be apparent from examination of FIG. 1 that it is also contemplated as being within the scope of the present invention to provide for more than one such column of connectors 28 to be disposed horizontally across the faceplate 26 whereby each vertical column of such connectors 28 may receive mating connectors disposed on corresponding other such module assemblies as module 12 in like manner to that described in the connection between module assembly 12 of FIG. 1 and the chassis 14.

Still referring to FIG. 1, as previously noted the pneuamtic connector 28 is preferably of the "quick connect" variety commercially available in several convenient forms and further containing a normally closed sealing valve (not depicted) disposed therein. On the distal end of the connector 28, there may be conveniently provided one of a number of convenient connector means 31 for securing the pressurized pneumatic line 37 to connector 28 in a pressure tight seal. At the proximal end of connector 28 a plug-in type female joint 29 may be provided whereby upon introduction of a mating male joint 45 of connector 38a into the annulus of joint 29 a pressure tight seal is effected and the aforementioned internal valve is opened whereby pressure within line 37 may be communicated through connector 28 and through connector 38a into the module assembly 12. For this purpose, it will accordingly in passing be noted that connector 38a is typically provided with a convenient O-ring seal about joint 45. It will also be noted that connectors such as 38a on module 12 are preferably "float" mounted: and are capable of slight movement in the plane of back support 33, to compensate for slight inaccuracies in alignment of connectors 28 and 38a during plug-in of module 12 to chassis 14.

Continuing with description of the chassis 14, with continued reference to FIG. 1 there will be seen a pair of spacers 20 extending horizontally across the faceplate 26 and a printed circuit motherboard 18, the motherboard 18 and spacer 20 of which may be fastened to the faceplate 26 by any convenient means such as the fasteners 150 depicted in FIG. 1. Mounted on the motherboard 18, again by any convenient means such as the fasteners 152, there may be seen a pair of printed circuit board edge tab connectors 22 and 24 of any typical commercially available variety. Inspection of FIG. 1 will reveal that the motherboard 18 is provided with a plurality of holes such as hole 54 adapted to receive in registry the connector pins such as pin 48 of their corresponding connectors. For purposes which will become readily apparent hereinafter, it will further be noted that the motherboard 18 is provided with a plurality of electrical connector bus lines such as bus 50 and 52 whereby electrical connection will be made from inside the slot 46, for example, of connector 22 horizontally to the left of the motherboard 18 and all along the corresponding bus line which corresponds to the pin associated with the particular connector slot. As in the case of the connectors 28, although only two edge tab connectors 22 and 24 have been depicted in FIG. 1, it will be apparent from the additional vertically aligned holes such as hole 54 provided to the motherboard 18 that it is contemplated that additional such pc board connectors will be fastened in like manner to that of connectors 22 and 24 to the motherboard 18 for purposes of receiving additional module assemblies and printed circuit boards such as module 12 and pc board 42.

A more detailed description of the module assembly 12 depicted in FIG. 1 will now follow. Structurally, a typical module assembly 12 of the present invention may include a faceplate 32 to which is attached a handle 44 for facilitating plug in and carrying of the module 12, a back cover 34 and a printed circuit board 30, the faceplate 32, pc board 30 and cover 34, acting in concert to form the generally rectangularly shaped box-like container, the aforementioned faceplate, board, and cover being rigidly interconnected by any convenient means such as fasteners or the like. A closer examination of the module assembly 12 of FIG. 1 will reveal that the cover 34 will include a back support 33, the purpose of which is to provide a mounting surface for the connector 38a. It will be recalled from the hereinabove discussion that it is within the scope of the invention to provide for a plurality of mating vertically aligned connectors 28 with corresponding connectors 38a-d which may be mounted vertically on back support 33.

The plurality of connectors 38a carried by the support 33 will be arranged so as to matingly engage a correlative plurality of connectors 28 carried by the faceplate 26 when the particular module assembly 12 carrying these connectors 38a is plugged into the chassis 14. It will be noted that the cover 34 is provided with a tab 34a extending vertically above the support 33 and a like tab 34b at the lower portion of cover 34. In like manner, pc board 30 may be conveniently provided with a tab 30a extending above the support 33 and a like tab 30b on the lower portion of pc board 30. The purpose of these tabs is as follows. Whereas for purposes of clarity a chassis cover has not been depicted in FIG. 1, it is conventional to provide a box-like chassis onto which the faceplate 26 is mounted, the box having an opening adapted for receiving one or more module assemblies 12 and pc boards 42 from the rear. Such a chassis cover would preferably include a tab guide such as guide 16 depicted in FIG. 1 for each of the upper and lower tabs 34a, 34b, 30a, and 30b, said guides 16 being attached inside the chassis cover whereby they may slidably receive their respective tabs in the channels provided in the guides 16.

In this manner, as the module assembly 12 is slid into the chassis 14 from the rear opening in the chassis cover, the slots in the guides 16 for each of the four tabs for a particular module assembly 12 will co-act to receive their respective tabs in registry. This will cause the particular module assembly 12 to slide toward the faceplate 26 in a predetermined alignment so as to cause the edge tab connector 40 of pc board 30 and the connector 38a to reliably engage their respective edge tab connector 22 and female joint 29. This will simultaneously effect pneumatic connection between connector 38a and connector 28a and electrical connection between edge tab connector 40 and connector 22 upon the plugging in of module assembly 12.

It may, in like manner, be desirable to provide such guides 16 or other means for insuring that pc boards such as board 42 will reliably slidably engage their respective connectors such as connector 24, a further purpose of such guides 16 being to provide support for the module assemblies 12 and pc boards 42 depending upon the orientation of the chassis 14. Again, for purposes of clarity, it will be noted that in FIG. 1 an electrical connector has not been shown therein connecting the various bus lines such as 50 and 52 to electrical lines outside the chassis 14 (power supply lines, communication lines, and the like), although such connection may be effected in any of a number of manners conventionally known in the art.

Figure 2:
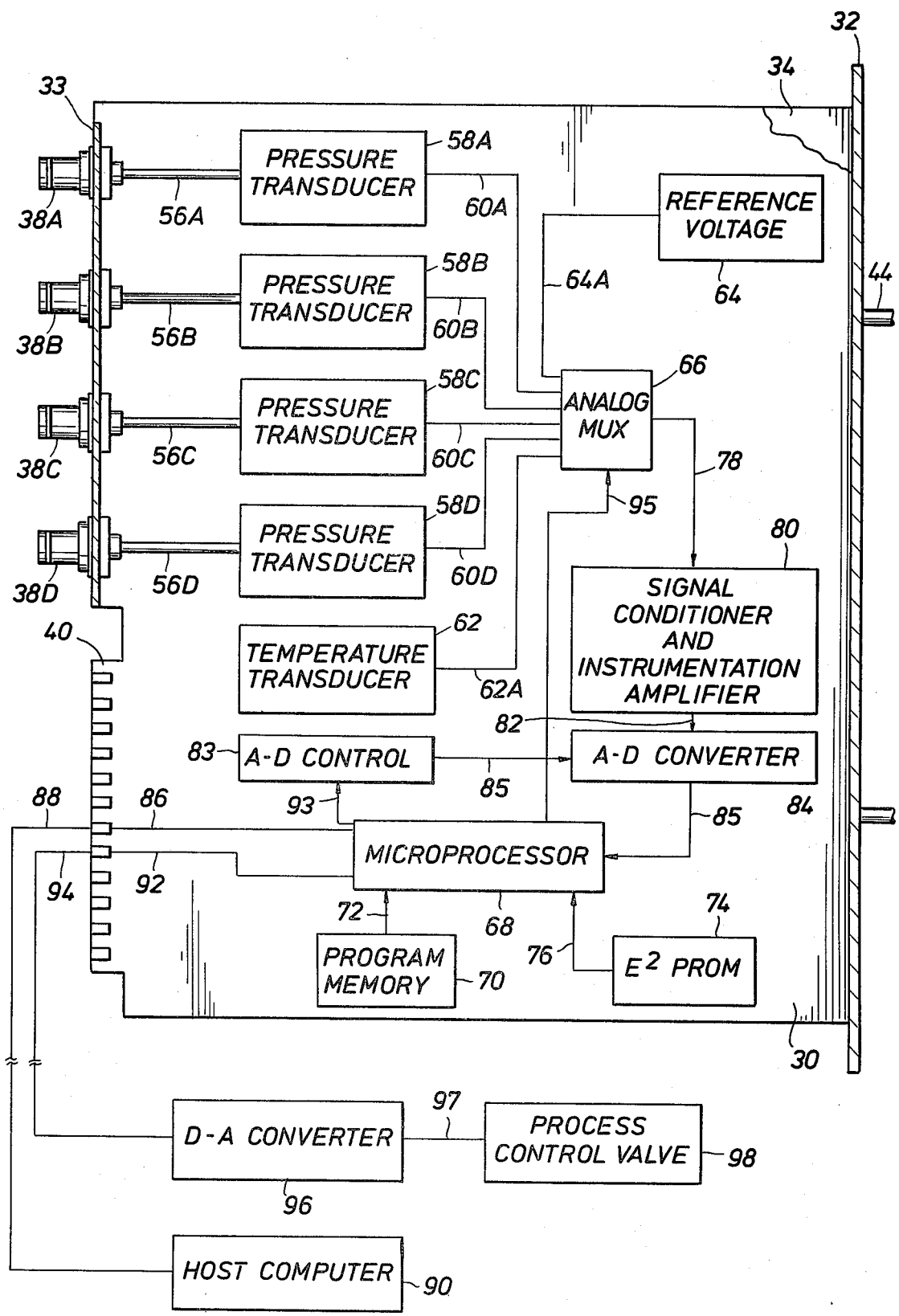
FIG. 2 is a more detailed depiction of a module assembly depicted in FIG. 1.

With reference now to FIG. 2, there will be seen depicted therein, in part, a more detailed description of an embodiment of one type of modular assembly 12 of the present invention. In particular, this Figure depicts the typical contents of such a module 12. First, in order to illustrate the previously described embodiments wherein, for some applications, multiple pressure points are being monitored, there will be seen depicted on one module assembly 12 a plurality of pressure connectors 38a-d arranged in-line. Each such connector will have a corresponding fitting (such as fitting 41 depicted in FIG. 1) for interconnecting the particular connector 38a-d by means of a pneumatic connector tube 56a-d to a corresponding pressure transducer 58a-d. The purpose of transducers 58a-d is to convert to a correlative analog voltage the respective pressures introduced thereto in tubes 56a-d (which correspond to pressure points desired to be monitored).

The analog electrical outputs of each transducer 58a-d are delivered on corresponding tranducer output lines 60a-d to an analog multiplexer or mux 66, the mux output 78 of which is, in turn, delivered to conventional signal conditioner and instrumentation amplifier circuitry 80. The output of this conditioner/amplifier 80 circuitry is delivered, in turn as output 82 to the input of an A-D converter 84, and the digitized output 85 is thence available for storage and processing, as functionally depicted by its delivery to microprocessor 68.

Referring generally to the operation of the circuitry depicted in FIG. 2 it will be noted that a program memory 70 may be provided for controlling the sequential operation of the various components carried by the various module assemblies such as assembly 12 and pc boards such as board 42. Representative types of subprograms will be hereinafter discussed in more detail with reference to FIGS. 3A-C. As but one purpose of such programming, it will be apparent from FIG. 2 that due to the provision of a plurality of transducers 58a-d, it will be necessary to sequentially scan the outputs thereof provided on lines 60a-d inorder to sequentially convert the monitored pressures corresponding to those introduced to connectors 38a-d to electrical form for storage.

Accordingly, the microprocessor 68, in response to program steps stored in program memory 70 and delivered on line 72 to the microprocessor 68, will cause the microprocessor to generate a sequence of command outputs functionally depicted by line 95 so as to cause the mux 66 to, in sequence, connect for sequential conversion to digital form each of the pressure transducer outputs 60a-d. Conventional A-D control circuitry 83 is further provided under control of a microprocessor output 93 which will generate appropriate control signals 85 for timing, resetting, and the like of the converter 84 for the aforementioned sequential conversion of the various signals introduced into the analog input 82 of the converter 84.

More particularly, as the mux 66, in response to commands 95 sequentially delivers each analog signal corresponding to transducer output 60a-d, each such analog signal will be, in sequence, delivered on mux output 78, conventionally conditioned such as for appropriate signal levels filtered, and the like, whereupon the signals will, sequentially be converted to digital form by converter 84 and stored by the microprocessor 68.

It will be noted that two additional analog signals may be converted to digital form and stored for purposes to be hereinafter described with respect to FIGS. 3A-C. Specifically, the temperature transducer 62 may be provided having an analog temperature output voltage 62a which may also be delivered to mux 66 for digitization. Also, a reference voltage generator 64 may be provided for delivering tightly controlled known reference voltages on output 64a to mux 66 for conversion to digital form.

As will also be described later in more detail, $E^2$ PROM memory 74 may be provided which will contain offset and gain data and information regarding transfer characteristics of transducers 58a-d in order to provide adjustment of the converter output signals 85 to compensate for transducer non-linearities, offsets, and the like. Due to the standard bus connections provided by the connectors such as 22 and motherboard 18, it will be noted that, as is conventionally known in the art, it is possible to intercommunicate between any pc boards such as 42 or module assemblies 12 interconnected on the motherboard 18 as well as to intercommunicate between any such assembly or board and a peripheral or host computer 90 by addressing the particular module 12 or board 42.

Accordingly, it will be apparent that although the program memory 72 and $E^2$ PROM memory 74 are depicted as residing on the same pc board 30 as the transducers 58a-d and other circuitry disclosed therein, it is within the scope of the invention to provide such program memory, processing as well as communication circuitry or the like on their own dedicated pc boards which will be plugged into connectors such as connector 24. In passing, it will be noted that one of the convenient benefits to the arrangement of each pair of edge tab connectors 22 and 24 is that upon plugging in of the corresponding module assembly 12 into the motherboard 18, the corresponding pc board 42 is enclosed for protection within the housing formed by the walls of the cover 34 and pc board 30.

Because as aforementioned, it is possible to provide a relatively sophisticated processing capability resident within the chassis 14 as, for example, on a separate processing pc board 42, it is within the scope of the invention to not only monitor pressures from various points associated with pressure connectors 38a-d in a process control application. Rather, it is further contemplated that in response to such monitoring, the converter assembly 10 of the present invention will utilize processing capability to generate process control signals. Accordingly, the microprocessor 68 may generate such control signals in response to any desired process control program resident in memory 70 and generate an appropriate process control signal 92. In but one application thereof depcited in FIG. 2, such a signal may be delivered out a conductor on an edge tab connector 40 to an outside control line 94 and delivered to an appropriate D-A converter 96. This converter 96 will, in turn, decode the command signal 94 and generate an analog output 97 which may be used to control, for example, a process control valve 98, thus providing a generalized or general purpose process controller which not only passively monitors various critical pressure points in given process, but actively may close the loop controlling the process in any desired manner.

It will be recalled that one of the features of the present invention is to provide a module assembly 12 wherein the various output signals appearing on transducer output lines 60a-d corresponding to pressures introduced into respective pressure transducers 58a-d may be adjusted or corrected for various reasons electronically within the module assembly 12. As but one example, pressure transducers will frequently exhibit non-linearities, in their transfer characteristics. This is particularly true in the case of lower cost non-compensated varieties which are more desirable for some applications. It will thus be apparent that in some instances it may be desirable to compensate for these non-linearities, gains and offsets of the transducers. More particularly, one such non-linearity may be introduced may arise from use of non-temperature compensated pressure transducers, which are typically lower in cost, but exhibit the characteristic wherein outputs will vary as a function of the ambient temperature and it is thus accordingly desirable to eliminate this effect or reduce it to within a predetermined resolution.

Yet another example wherein it may be desirable to adjust within the module assembly 12 voltages associated with pressures delivered to the pressure transducers 58a-d occurs from the fact that it is frequently desirable to have such voltages in digital form. With reference to FIG. 2, it will be recalled that an analog-to-digital converter 84 may be provided for converting such transducer voltages appearing on lines 60a-d to digital form. However, as is well known in the art, such converters 84, in like manner to transducers, will have associated therewith zero offsets, varying gain factors, and the like. Accordingly, in like manner to adjusting for non-linearities caused by temperature and the like and offsets in the pressure transducers 58a-d, it will often be desirable to make adjustments for like factors associated with the converter 84 within the particular module assembly 12 housing the respective transducers 58a-d and converter 84.

Figure 3A:
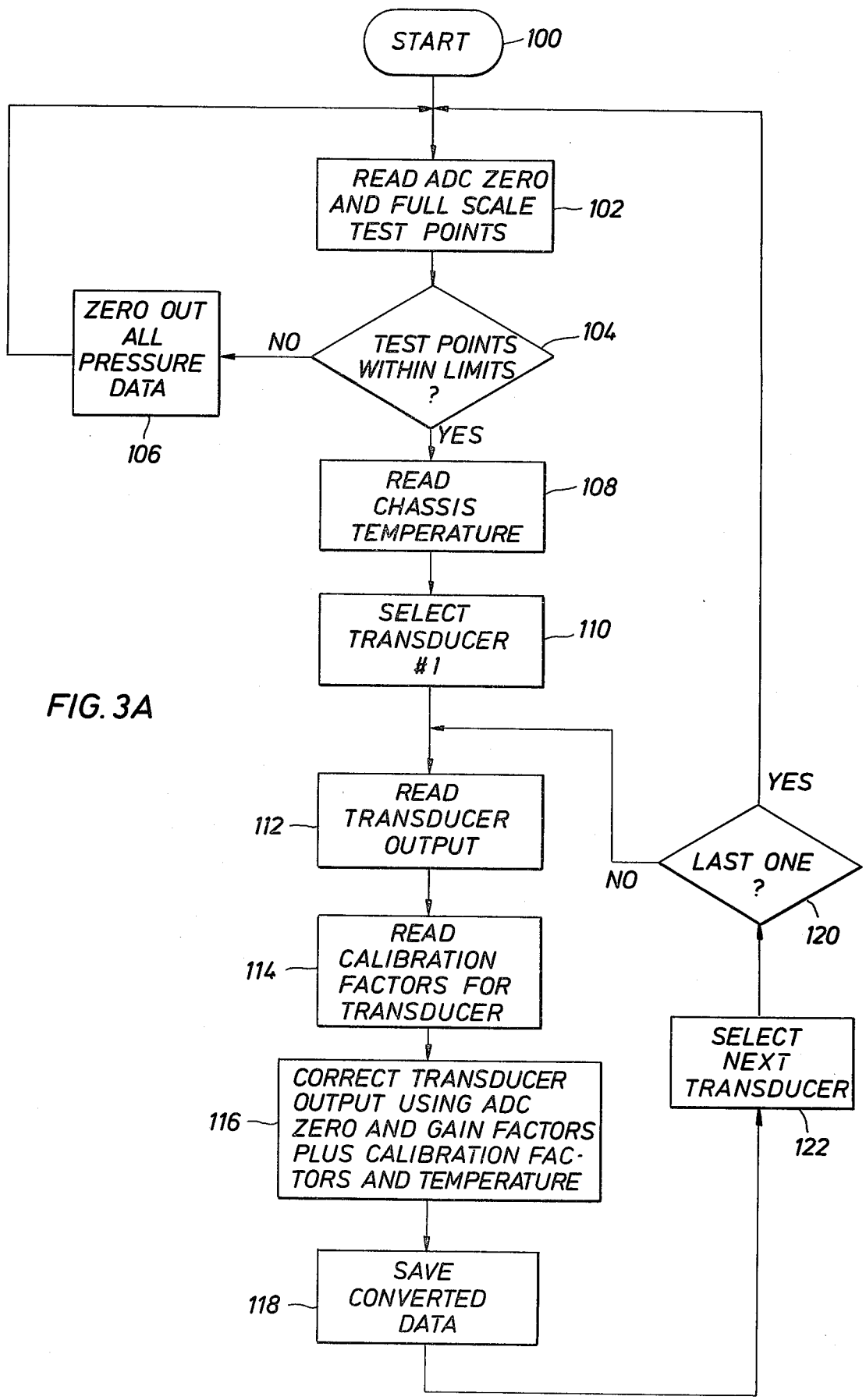
FIGS. 3A–3C are simplified flow diagrams of processing subroutines which may be employed in conjunction with the apparatus or the present invention depicted in FIG. 1.

Accordingly, with reference to FIG. 3a, there will be seen a typical subroutine desirably stored in convenient program memory 70 which may be delivered, as functionally depicted by memory output line 72, to a suitable microprocessor 68 which, in turn, will operate upon the subroutine to accomplish the aforementioned objectives of compensating for transducer and converter 84 characteristics. While the microprocessor 68 and program memory 70 have, for convenience, been depicted in FIG. 2 as residing in a particular module assembly 12 which includes the transducers 58a-d and converter 84, it will be apparent that due to the availability of numerous connections on the edge tab connector 40 and inner connection by means of the standard bus format compatability of connectors such as 22, and 24, and motherboard 18, these processing and program memory functions provided by microprocessor 68 and memory 70 may be implemented on one or more auxiliary printed circuit boards such as board 42 depicted in FIG. 1. However, for reasons which will hereinafter be more apparent, it is a feature of the present invention to at least provide within a particular module assembly 12 memory such as the $E^2$ PROM memory 74 which will store the aforementioned non-linearity, gain, and offset characteristics and the like of the transducers 58a-d and converter 84 which are also included within the particular module 12.

Referring again to FIG. 3A, regardless of where the processing and program memory is effected, it may first be desirable to compensate for transducer and converter 84 characteristics and accordingly a suitable computer program for implementing the steps of FIG. 3A may desirably be stored in memory 70 and retrieved by microprocessor 68 as required for implementation and operation upon the transducer outputs and converter 84.

Utilizing the illustration depicted in FIG. 3A, it will first be assumed that it is desirable to insure that converter 84 is operating properly. This may be done by introducing two known analog reference voltages on converter input 82 which, given the characteristics of the particular converter 84 utilized, should cause the digital output 85 of converter 84 to register zero and full scale. Such analog voltages corresponding to these zero and full scale test points may be generated by reference voltage circuits 64 and delivered as output 64a to analog mux 66. Microprocessor 68 will generate a first output 95 which passes first the zero test point analog voltage appearing on line 64a through the mux 66 on mux output 78 to conditioner/amplifier 80. This zero test point voltage, after conditioning and amplification by conditioner/amplifier 80 is delivered as an analog voltage 82 to converter 84 which should result in a binary output 85 of converter 84 corresponding to a zero voltage input on input 82.

The microprocessor 68 will thereafter generate a next control output 95 causing the mux 66 to pass a next voltage generated by the reference voltage generator 64 on output 64a through the mux 66 on mux output 78 to conditioner/amplifier 80. This voltage will correlate to the analog voltage which must be impressed on converter input 82 in order to generate a binary output 85 corresponding to the full scale range of the converter 84. In like manner to the zero test point, this analog reference voltage on mux output 78 will be conditioned and amplified appropriately on conditioner/amplifier 80, and delivered as the aforementioned converter input 82 to the converter 84 where it is converted into digital form and present on the converter output 85. The reading of these zero and full scale test points may be seen functionally and schematically represented as block 102 of FIG. 3A. The microprocessor 68 will then compare these actual conversions of the actual zero and full scale analog reference voltages generated by the generator 64 to the expected values thereof stored in memory 70 and will see if the test points are within a preselected limit of the expected value such as 1½%, this comparison being indicated by block 104. If the microprocessor 68 detects that the actual converter values for the zero and full scale test points exceed the known values by more than the preselected limit, this indicates that the particular module assembly 12 is in some way defective. The microprocessor 68 will accordingly then generate an error flag is indicated in block 106 which will be available on the microprocessor output 86 for delivery on line 88 to a host computer 90 which is thus alerted to the defectiveness of the particular module assembly 12 and its corresponding pressure reading.

If however the test points are within preselected limits, indicated by block 104, it may next be desirable to adjust transducer outputs for non-linearities caused by varying ambient temperatures. Referring to FIG. 2, there will be seen a temperature transducer 62, such as a thermistor or the like of any appropriate design, which will deliver a temperature transducer output voltage 62a corresponding to the ambient temperature proximal to the transducers 58a-d to the mux 66. As represented by block 108, the microprocesser 68 will generate a next output 95 passing this temperature transducer output voltage 62a through the mux 66. In like manner to conversion of the reference voltages 64a, this temperature transducer voltage 62a will appear as mux output 78a, which is, after conditioning and amplification by conditioner/amplifier 80, delivered as an analog voltage 82 on the input of converter 84 for conversion to digital form. Thus, appearing on the converter output 85 will be a digitized equivalent of the temperature surrounding the transducers 58a-d, as schematically indicated by block 108. This chassis temperature measurement may then be stored in memory 70 for purposes to be later described.

Still referring to FIGS. 2 and 3A, the microprocessor 68, in response to the subroutine of FIG. 3A stored in program memory 70, will thence generate a next output 95 so as to cause the transducer output 60a of the first transducer 58a to be delivered to the mux 66. It will be recalled that the purpose of each transducer 58a-d is to convert a pressure appearing in its corresponding pneumatic connector tube 56a-d into a correlative analog voltage on its corresponding transducer output line 60a-d which corresponds functionally to the pressure introduced to the transducer. Continuing with the present example, in response to the output 95, the first transducer output appearing on line 60a is delivered through mux 66 as mux output 78 through the conditioner/amplifier 80, and thence delivered on line 82 to converter 84 for converting to digital form. Thus, the output 85 will be the digital equivalent of the analog voltage present on line 60a.

It will be recalled from the foregoing that pressure transducers characteristically are not linear, but rather exhibit non-linearities in their transfer characteristics due to temperature variations and the like, as well as DC offsets which must be calibrated out. One feature of the present invention is to provide for the storage in $E^2$ PROM memory 74 all such calibration factors associated with each transducer 58a to compensate for such non-linearities and offsets, and moreover, to provide for such storage within the same module assembly 12 in which the transducers 58a-d are contained. One reason for this, as previously described, is so that when a module assembly 12 is replaced by another such assembly, there is no need to recalibrate and adjust for the substituted transducers in the replacement module in that they are already resident in the module itself. Moreover due to the provision of electrically erasable ($E^2$) memory when a transducer module 12 is removed from chassis 14, the transducers, converters or other circuitry (or replacements thereof) may be tested for new calibration and compensation data without removing them from module 12 and this data may then be immediately stored in the $E^2$ memory which has remained in module 12 during the testing of the transducers, circuitry, etc.

Still referring to FIG. 3A, as represented by block 114, these calibration factors and non-linearity transfer characteristic functions for the particular first transducer may be desirably retrieved by the microprocessor 68 from memory 74, as functionally indicated by memory output 76. Moreover, as indicated by block 116, the zero and gain factor characteristics for the particular converter 84 as well as the temperature of the module's chassis, as read in the previously described manner, may be retrieved by the microprocessor 68. After retrieving the reading of the first transducer 58a, as indicated by block 112, the microprocessor 68 will thereafter adjust this reading in accordance with the converter zero and gain factors and the transducer calibration and temperature or other non-linearity factors just retrieved as indicated by block 114. The microprocessor 68 will thus calculate a "corrected" reading for the pressure introduced to transducer 58a, corrected for the aforesaid factors, and as indicated by block 118, this result will be stored in some convenient memory. It will be appreciated that this value will, after having compensated for transducer non-linearity such as those caused by temperature drift, offsets, and the like, thus more accurately reflect what the actual pressure is in the pneumatic connector tube 56a.

The microprocessor 68 will thereafter, again in response to program memory 70 as indicated in block 122 of FIG. 3A, generate a next output 95 instructing the mux 66 to pass the next transducer output 60b from transducer 58b through the mux 66 for conversion to digital form as previously described with respect to the first transducer output 60a. As indicated by block 120, the microprocessor 68 will thence determine whether all such transducers 58a-d have been interrogated, and if not, the subroutine will branch to block 112 wherein the transducer output thus selected by output 95 is passed through mux 66 for conversion in like manner to transducer output 60a.

When the microprocessor 68 has determined that all such transducer outputs have been read, adjusted and corrected for converter 84 offset and gain factors as well as for transducer calibration for offset and non-linearity, and the results have thus been stored, as indicated by block 120, the subroutine will branch back to the start of the subroutine. It will be appreciated that in response to program steps stored in memory 70, the outputs of the pressure transducers 58a-d may be scanned in any desired fashion such as at any rate, order or sequence, and that after each such scan or pass, digital values will reside in storage corresponding to pressures impinging on each transducer which have been corrected for non-linearities and calibration constants.

In some process control applications it is desirable to monitor a plurality of pressures at certain process control points at a central location, and to generate digital representations of such pressures or functions thereof (such as limit checks, control signals or the like), and to deliver such representations to a host process control computer such as computer 90 of FIG. 2 or back to some point which is desired to be controlled.

Figure 3C:
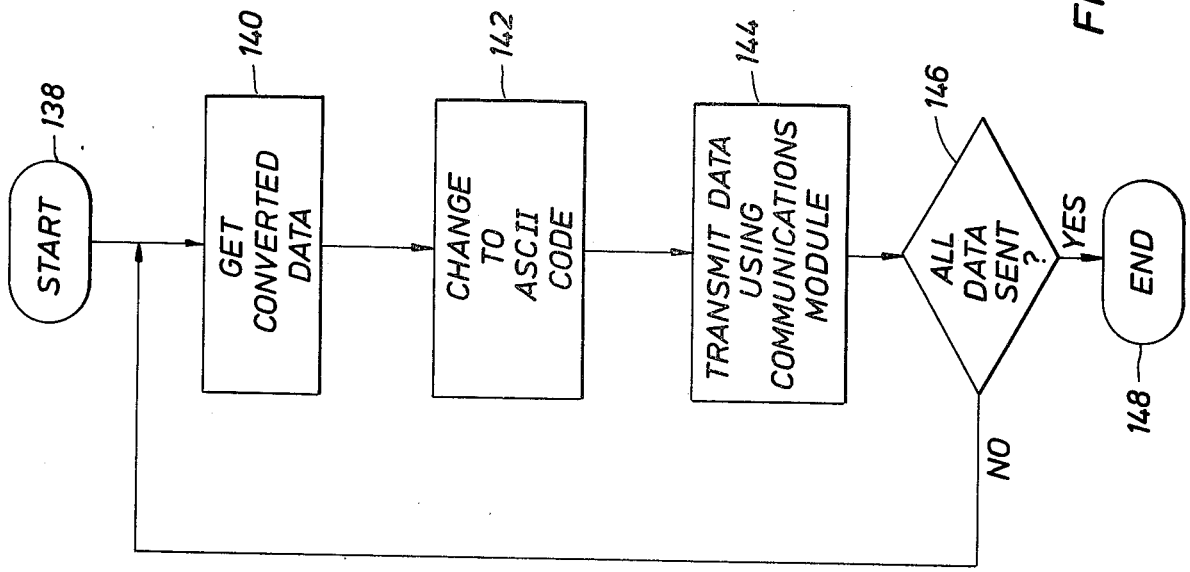
Figure 3B:
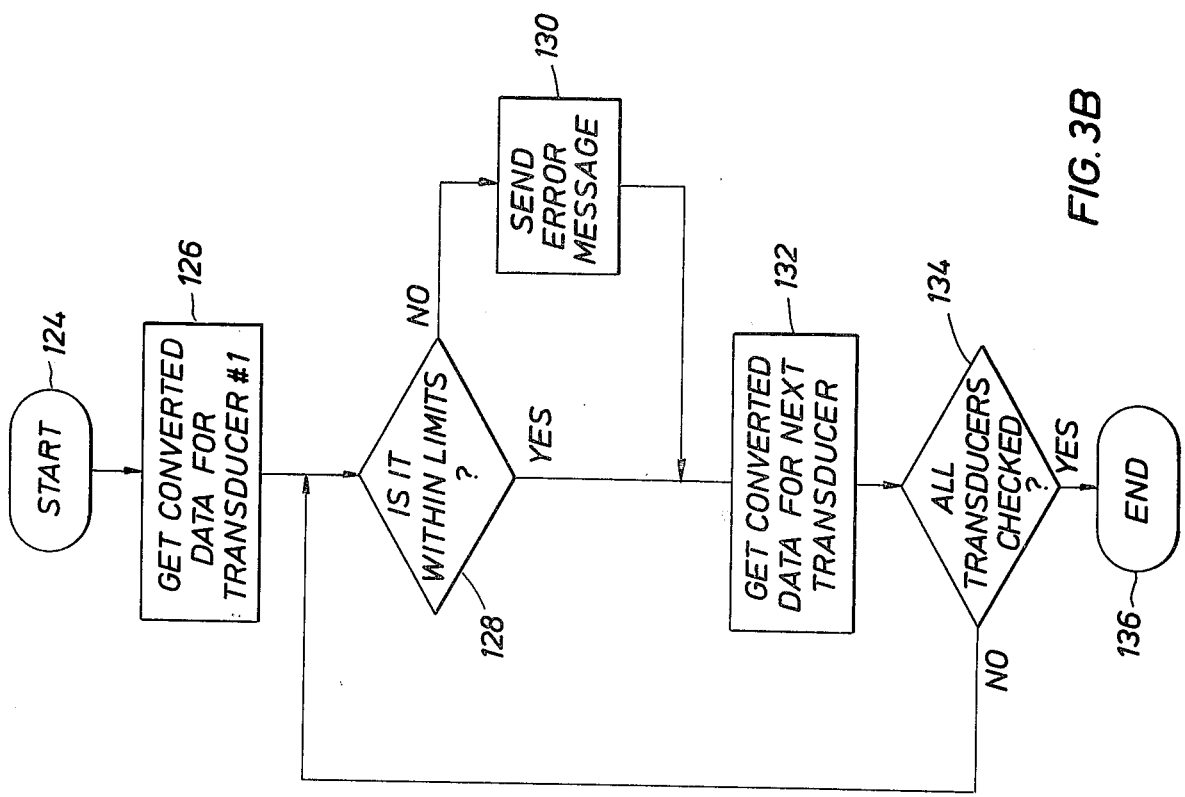

Thus, referring to FIG. 3B, there may be seen, in like manner to that of FIG. 3A, a representative subroutine appropriate for storage in a program memory 70 which may provide limit checks on the pressures monitored at one or more pressure points in the process control and delivered to corresponding transducers contained in one or more of the module assemblies 12 which are plugged into the chassis 14.

Referring now to FIG. 3B there will be seen an illustrative flow diagram of a subprogram to be stored in memory 70 for accomplishing the aforementioned limit checking. It will be recalled that upon completion of a scan of transducers 58a-d, the converted data will be stored in appropriate memory as indicated by block 118. In response to the subroutine of FIG. 3B, the microprocessor 68 may recall the subroutine of FIG. 3B as indicated by block 124, and recall the storage the stored and converted data for the first transducer 58a as indicated by block 126. This data may then be checked against a predetermined limit which may either be fixed or a function of other variables also recallable from memory. Upon such comparison, as indicated by block 128, the data for transducer 58a will either be within the limits or exceed them, and if not within the permissible limits, the microprocessor 68 may generate an error message indicated by block 130 for delivery on microprocessor output 86 to a host computer 90. However, in accordance with the subroutine of FIG. 3B, if the data from transducer 58a is within acceptable limits, the microprocessor 68 will thence obtain from storage converted data for the next pressure transducer 58b as indicated by block 132 and a test will be performed to determined whether all such transducer data has been retrieved and tested against limits as indicated by block 134. If not all such transducer data has been checked, the subroutine will loop back to the limit test of block 128 for the next transducer data thus retrieved and, in like manner to the converted data from transducer 58a will test to see if the data from transducer 58b is within acceptable limits. If not, an error message will be generated as indicated by block 130, and if so, data for the next transducer will be retrieved in accordance with block 132 and tested against limits. This process will continue until all such transducers have been limit checked, as indicated by block 134 whereupon the subroutine ends, as indicated by block 136.

It will be recalled that it may also be desirable to transmit measured transducer data or control signals developed in response thereto by the microprocessor 68 from the converter assembly to a remote location such as the host computer 90 or to one or more D to A converters 96 of FIG. 2. Accordingly, with reference to FIG. 3C there will be seen an illustrative subprogram which, in like manner to that of FIGS. 3A and B, may conveniently be stored in some appropriate program memory 70 resident either on one of the printed circuit boards 30 of one of the module assemblies assemblies 12 or on one of the auxiliary printed circuit boards 42.

Referring more particularly to FIG. 3C, upon recall of the subroutine illustrated therein by the microprocessor 68, as indicated by block 138, one of the transducer data points converted in accordance with FIG. 3A (and stored and limit checked, if desired, in accordance with FIG. 3B), is retrieved from storage by the microprocesser 68, as indicated by block 140, changed to a convenient code such as ASCII well known in the art and illustrated by block 142, and such encoded data point may thereafter be transmitted on line 86 out of a conductor 88 interconnected to one of the conductors of edge tab 40 to a host computer 90, or alternatively, on a line such as 94 indicated in FIG. 2 to a converter 96 if the transmitted code is a command signal which is a function of one of the measured transducer points.

This transmission is schematically depicted by block 144 wherein it will be noted that in reality a communications module assembly like that of assembly 12 or an auxiliary printed circuit board 42 may be provided (not shown). Accordingly, while the encoded data is, in FIG. 2, represented as being transmitted directly from the microprocessor 68 to the desired destination such as the host computer 90, this has been so depicted for simplicity, whereas, in reality, the microprocessor output 86 containing the encoded data would, more conventionally be routed by means of one of the bus lines such as 50 or 52 on the motherboard 18 to appropriate circuitry in a communications module contained in a module assembly similar to that of assembly 12 or an auxiliary printed circuit board 42 also connected to the motherboard 18. The encoded data would thence be routed through conventional circuitry known in the art and associated with such communication modules, such as a modem or the like, and would thence be routed to the aforementioned output lines 88 or 94 running from a connector connected to the bus lines 18 of the motherboard to the desired remote locations.

Still referring to FIG. 3C, the microprocessor 68, in accordance with the subroutine of FIG. 3C, will then perform a check indicated by block 146 to determine whether all desired data has been sent, which, in the case of FIG. 2 as illustrated, would, for example, result in a test to see whether all data from one scan of all transducers 58a-d had been transmitted. If all such data had not been transmitted, the subroutine would route back to block 140 whereby the next converted data point of transducer 58b will be retrieved, converted to convenient form such as the aforementioned ASCII code, transmitted to a communications module plugged into the motherboard 18, all in accordance with blocks 140, 142, and 144, and the resultant encoded data thereafter delivered to the computer 90 or converter 96. As indicated by block 148, after the test of block 146 has been completed indicating that all data has been sent, the subroutine will then end, as indicated by block 148.

It will be readily apparent that the subroutines of FIGS. 3A-3C have been provided only for purpose of illustration and that the present invention admits to application of any number of routines for providing limit checks, communication, scanning orders of transducers carried on any of the module assemblies 12 which may be plugged intothemotherboard 18, or the like, such subroutines being adapted to the particular application of the converter assembly 10 of the present invention. Thus, for example, transducers carried on a plurality of module assemblies 12 may be scanned in any particular order, and the limit checks of FIG. 3B and data transmission routine of FIG. 3C may be conducted simultaneously with the scanning routine of FIG. 3A if desired, or at any other time, and the subroutine of FIGS. 3A–3C have accordingly been provided only for purposes of illustration.

It is a particular feature and object of the present invention to provide a general purpose pneumatic-digital converter to be adapted to any one of a number of applications, and accordingly provision has been made by means of the motherboard and arrangement of connectors such as 22, 24, 40, 38a, and 28 whereby, in conjunction with standard commercially available busing, in which the connections of pins such as 48 and the bus lines 50, 52, and the like are arranged, intercommunication is possible between any module assembly 12 or auxiliary printed circuit board 42 plugged into respective connectors 28, 22, and 24 such as data and control information.

It is therefore apparent that the present invention is one well adapted to obtain all of the advantages and features hereinabove set forth, together with other advantages which will become obvious and apparent from the description of the apparatus itself. It will be understood that certain combinations and subcombinations are of utility and may be employed without reference to other features and subcombinations. Moreover, the foregoing disclosure and description of the invention is only illustrative and explanatory thereof, and the invention admits of various changes in the size, shape and material composition of its components, as well as in the details of the illustrated construction, without departing from the scope and spirit thereof.

What is claimed is:

1. A transducer module assembly for use with a pneumatic to electrical converter system chassis, comprising:
    a float mounted pneumatic connector of the normally closed, self-sealing quick connect type disposed on one end of said module;
    an electrical connector of the printed circuit board edge tab type disposed on said end of said module;
    pressure transducer means interconnected to said pneumatic connector for converting monitored pressures to electrical signals;
    electronic circuit means interconnected between said electrical connector and said pressure transducer for processing said electrical signals wherein when said electronic circuit means lies substantially in a vertical plane having an edge which includes said end, said pneumatic and electrical connectors lie substantially in said plane aligned vertically above each other and along said edge;
    said electronic circuit means further including
        $E^2$ PROM memory means and an analog to digital converter for storing data corresponding to said transducer means; and
        analog to digital converter means for converting said electrical signals to analog form; and
        means for adjusting said electrical signals as a function of said temperatures;
    temperature transducer means interconnected to said electronic circuit means for detecting ambient temperature surrounding said pressure transducer means;
    processor means interconnected to said memory means and said electrical connector means for adjusting said electrical signals as a function of said stored transducer data; and
    a chassis having
        a printed circuit motherboard having a plurality of electrical conductors;
        a first electrical connector disposed on said motherboard for receiving said electrical connector of said module assembly; and
        a second electrical connector disposed on said motherboard parallel to said first connector, said first and second electrical connectors being electrically interconnected by means of said conductors; and
    an auxiliary printed circuit board adapted to be received by said second electrical connector, said module assembly enclosing said auxiliary printed circuit board when said electrical connector is disposed in said first electrical connector of said chassis.

2. A chassis for receiving a plurality pressure monitor lines and a plurality of module assemblies, each said module assembly having a pneumatic module connector, an electrical module connector, and an electronic circuit means interconnected between said pneumatic module connector and said electrical module connector, said chassis comprising:
    a face plate;
    a plurality of pneumatic connectors carried on said face plate, each providing pneumatic interconnection between a different one of said pneumatic module connectors and a corresponding different one of said pressure monitor lines;
    a plurality of electrical connectors carried on said face plate, each providing electrical connection to a different corresponding one of said electronic circuit means; and
    a plurality of bus lines carried on said face plate electrically interconnecting different ones of said electronic circuit means when said electrical module connectors of said module assemblies are inserted in respective different ones of said plurality of electrical connectors.

3. The apparatus of claim 2, wherein said plurality of bus lines comprises a plurality of horizontally extending bus line conductors carried by a motherboard mounted on said face plate.

4. A module assembly for use with a pneumatic to electrical converter system chassis, comprising:
    a printed circuit board having an electrical connector for connection to said chassis;
    a back support interconnected to said printed circuit board and lying in a plane intersecting said printed circuit board; and
    a float-mounted pneumatic connector carried by said back support for connection to said chassis.

5. The apparatus of claim 4, further comprising:
    a pressure transducer releasably interconnected to said pneumatic connector for converting pressures delivered to said pneumatic connector from said chassis to electrical signals;
    electronic circuit means interconnected between said electrical connector of said printed circuit board and said pressure transducer for processing said electrical signals, said electronic circuit means including
        $E^2$ PROM memory means for storing data corresponding to said transducer means.

6. A pressure monitoring system for monitoring pressures on a plurality of pressure monitor lines, comprising:
- a chassis comprising
  - a face plate;
  - a plurality of pneumatic chassis connectors carried on said face plate, each interconnectable to a different one of said pressure monitor lines;
  - a plurality of electrical chassis connectors carried on said face plate; and
  - a bus line conductor means for electrically interconnecting said plurality of electrical chassis connectors; and
- a plurality of module assemblies, each comprising
  - a printed circuit board having an electrical connector disposed in one of said plurality of electrical chassis connectors;
  - a pneumatic module connector carried by said printed circuit board and disposed in one of said plurality of pneumatic chassis connectors; and
  - electronic circuit means interconnected between said printed circuit board electrical connector and said pneumatic module connector.

7. The apparatus of claim 6, wherein said electronic circuit means of at least one of said module assemblies includes:
- microprocessor means for electronically addressing at least one other of said electronic circuit means in a different one of said module assemblies through said bus line conductor means.

8. The apparatus of claim 7, wherein said electronic circuit means of at least one other of said module assemblies includes:
- a pressure transducer for converting monitored pressures delivered to said at least one other of said module assemblies to electrical signals; and
- $E^2$ PROM memory means for storing data corresponding to said transducer and for delivery of electrical information to said microprocessor, on said bus line conductors.

* * * * *